US007507589B1

(12) United States Patent
Johnson et al.

(10) Patent No.: US 7,507,589 B1
(45) Date of Patent: Mar. 24, 2009

(54) METHOD OF FORMING A MEMS INDUCTOR WITH VERY LOW RESISTANCE

(75) Inventors: Peter Johnson, Sunnyvale, CA (US); Peter J. Hopper, San Jose, CA (US); Kyuwoon Hwang, Palo Alto, CA (US); Robert Drury, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 123 days.

(21) Appl. No.: 11/820,921

(22) Filed: Jun. 21, 2007

Related U.S. Application Data

(62) Division of application No. 11/200,384, filed on Aug. 9, 2005, now Pat. No. 7,250,842.

(51) Int. Cl.
*H01L 21/00* (2006.01)

(52) U.S. Cl. .......................... 438/3; 438/171; 438/381; 438/637; 257/E21.022

(58) Field of Classification Search ................. 438/171, 438/190, 329
See application file for complete search history.

(56) References Cited

U.S. PATENT DOCUMENTS 3,638,156 A 1/1972 West .......................... 336/200
3,881,244 A 5/1975 Kendall ....................... 29/602
5,372,967 A * 12/1994 Sundaram et al. ........... 438/381
6,008,102 A 12/1999 Alford et al. ................ 438/381
6,148,500 A 11/2000 Krone et al. ............... 29/602.1
6,292,084 B1 9/2001 Choi et al. .................. 336/200
6,573,818 B1 6/2003 Klemmer et al. .............. 336/83
6,990,729 B2 1/2006 Pleskach et al. ............... 29/606

OTHER PUBLICATIONS

*Jin-Woo Park, Florent Cros and Mark G. Allen, "A Sacrificial Layer Approach To Highly Laminated Magnetic Cores," in Proc. 15th IEEE Int. Confer. MEMS, Jan. 2002, pp. 380-383.

*Jin-Woo Park and Mark G. Allen, "Ultralow-Profile Micromachined Power Inductors With Highly Laminated Ni/Fe Cores:Application To Low-Megahertz DC-DC Converters", IEEE Transactions On Magnetics, vol. 39, No. 5, Sep. 2003, pp. 3184-3186.

*David P. Arnold, Florent Cros, Iulica Zana, David R. Veazie and Mark G. Allen, "Electroplated Metal Microstructures Embedded In Fusion-Bonded Silicon:Conductors And Magnetic Materials", Journal of Micromechanical Systems, vol. 13, No. 5, Oct. 2004, pp. 791-796.

*David P. Arnold, Iulica Zana, Florent Cros and Mark G. Allen, "Vertically Laminated Magnetic Cores By Electroplating Ni-Fe Into Micromachined Si", IEEE Transactions On Magnetics, vol. 40, No. 40, Jul. 2004, pp. 3060-3062.

* cited by examiner

*Primary Examiner*—Walter L Lindsay, Jr.
*Assistant Examiner*—Cheung Lee
(74) *Attorney, Agent, or Firm*—Mark C. Pickering

(57) ABSTRACT

A very, very low resistance micro-electromechanical system (MEMS) inductor, which provides resistance in the single-digit milliohm range, is formed by utilizing a single thick wide loop of metal formed around a magnetic core structure. The magnetic core structure, in turn, can utilize a laminated Ni—Fe structure that has an easy axis and a hard axis.

14 Claims, 4 Drawing Sheets

METHOD OF FORMING A MEMS INDUCTOR WITH VERY LOW RESISTANCE

This is a divisional application of application Ser. No. 11/200,384 filed on Aug. 9, 2005, now U.S. Pat. No. 7,250, 842, issued on Jul. 31, 2007.

BACKGROUND OF THE INVENTION

1. Field of the Invention

The present invention relates to MEMS inductors and, more particularly, to a MEMS inductor with very low resistance.

2. Description of the Related Art

A micro-electromechanical system (MEMS) inductor is a semiconductor structure that is fabricated using the same types of steps (e.g., the deposition of layers of material and the selective removal of the layers of material) that are used to fabricate conventional analog and digital CMOS circuits.

MEMS inductors are commonly formed as coil structures. When greater inductance is required, the coil structure is typically formed around a magnetic core structure. Core structures formed from laminated Ni—Fe have been shown to have low eddy current losses, high magnetic permeability, and high saturation flux density.

Although the MEMS inductors taught by Park et al., and others provide a solution to many applications, and thereby provide an easy process for providing an on-chip inductor, these MEMS inductors have an excessively high resistance for other applications, such as applications which require inductor resistance in the milliohm range. Thus, there is a need for a MEMS inductor that provides very low resistance.

DETAILED DESCRIPTION OF THE INVENTION

Figure 1A:
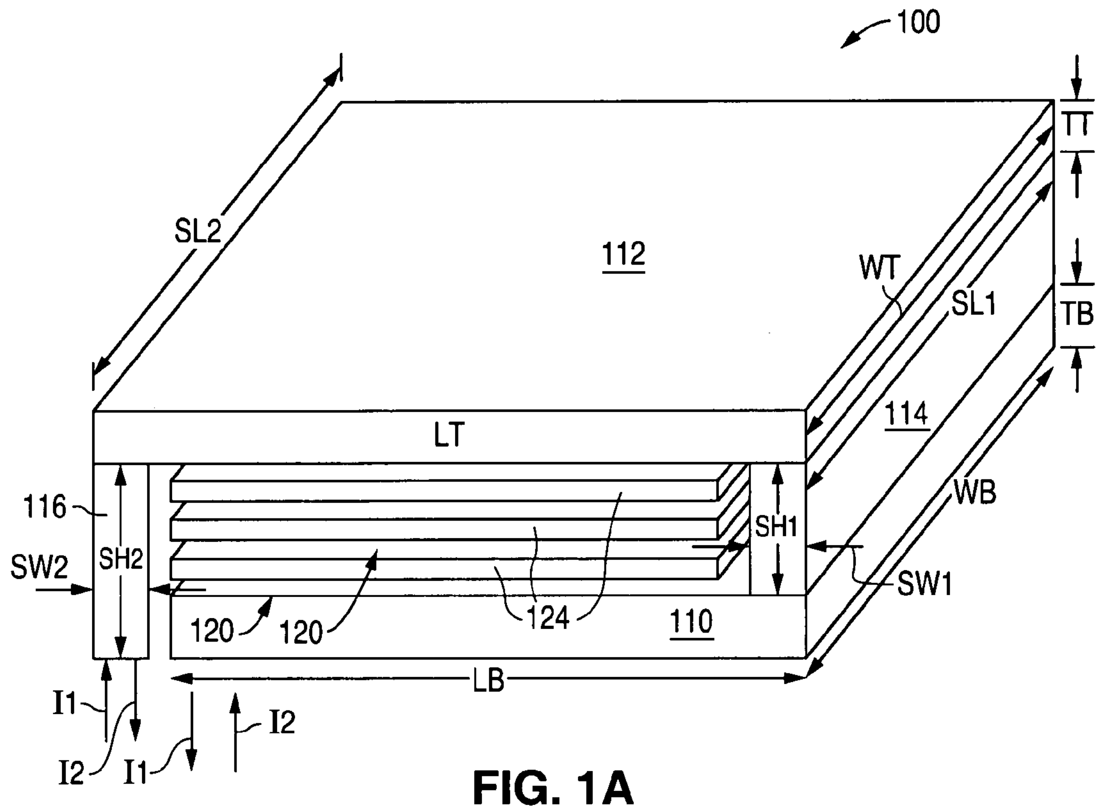
FIG. 1A is a perspective view illustrating an example of a MEMS inductor 100 in accordance with the present invention.

FIG. 1A shows a perspective view that illustrates an example of a MEMS inductor 100 in accordance with the present invention. As described in greater detail below, by utilizing a single thick wide loop of metal around a magnetic core structure, a single-loop inductor can be formed that provides very low resistance.

As shown in FIG. 1A, MEMS inductor 100 includes a base conductive plate 110 that has a length LB, a width WB, and a thickness TB. In addition, MEMS inductor 100 includes a top conductive plate 112 that lies over base conductive plate 110. Top conductive plate 112 also has a length LT, a width WT, and a thickness TT. In the present example, the widths and thicknesses of the plates 110 and 112 are substantially identical.

Further, MEMS inductor 100 includes a conductive sidewall 114 that has a bottom surface that contacts base conductive plate 110, and a top surface that contacts top conductive plate 112. MEMS inductor 100 also includes a conductive sidewall 116 that has a top surface that contacts top conductive plate 112.

In the FIG. 1A example, sidewall 114 has a height SH1 measured between the base and top conductive plates 110 and 112, a length SL1 substantially equal to the width WB of bottom conductive plate 110, and a width SW1. Further, sidewall 116 has a height SH2, a length SL2 substantially equal to the width WB of bottom conductive plate 110, and a width SW2 substantially equal to width SW1.

In addition, base conductive plate 110, top conductive plate 112, conductive sidewall 114, and conductive sidewall 116, which can be formed from materials including copper, define an enclosed region 120 that lies only between the base and top conductive plates 110 and 112, and sidewalls 114 and 116.

As further shown in FIG. 1A, MEMS inductor 100 includes a magnetic core structure 122 that is located within enclosed region 120, and within no other enclosed regions. Magnetic core structure 122, which is electrically isolated from all other conductive regions, can be implemented in a number of prior-art fashions.

For example, magnetic core structure 122 can be implemented with a number of laminated Ni—Fe cores 124. The thickness of the laminations must be thin enough to minimize eddy currents. In addition, magnetic core structure 122 can have an easy axis and a hard axis.

In operation, a current I1 can flow into MEMS inductor 100 along the bottom side of sidewall 116, and out along the near end of bottom conductive plate 110 that lies away from sidewall 114. A current I2 can also flow in the opposite direction, flowing into MEMS inductor 100 along the end of bottom conductive plate 110 that lies away from sidewall 114, and flowing out along the bottom side of sidewall 116.

A current flowing through an inductor generates a magnetic field which, when the inductor surrounds a ferromagnetic core, produces a magnetic flux density. The magnetic flux density, in turn, is a measure of the total magnetic effect that is produced by the current flowing through the inductor.

Figure 1B:
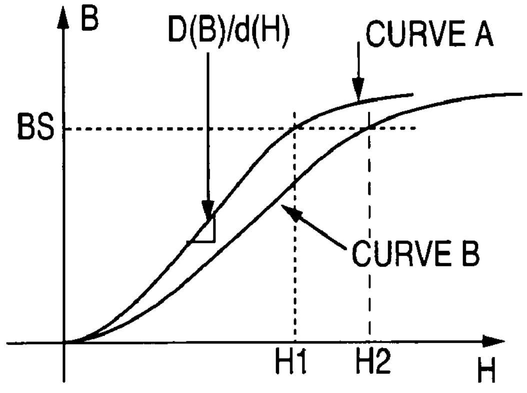
FIG. 1B is a graph illustrating a magnetic field H versus a magnetic flux density B in accordance with the present invention.

FIG. 1B shows a graph that illustrates a magnetic field H versus a magnetic flux density B in accordance with the present invention. As shown in FIG. 1B, as the current through inductor 100 and the magnetic field H increase, the magnetic flux density H linearly increases, hits a knee at a specified flux density, and then saturates such that further increases in current through the coil to produce a greater magnetic field H produce very little increase in the magnetic flux density B.

In the FIG. 1B example, curve A hits a saturation knee equal to a specified flux density BS at a first magnetic field H1, while curve B hits a saturation knee equal to the specified flux density BS at a second magnetic field H2. In the present invention, curve A represents the case of when the easy axis of magnetic core structure 122 coincides with the length LB of bottom conductive plate 224. On the other hand, curve B represents the case when the hard axis of magnetic core structure 122 coincides with the length LB of bottom conductive plate 224.

In other words, when the easy axis of magnetic core structure 122 coincides with the length LB of bottom conductive plate 224, the maximum current through the coil can be equal to the current required to produce the magnetic field H1. When the hard axis of magnetic core structure 122 coincides with the length LB of bottom conductive plate 224, the maximum current through the coil can be equal to the current required to produce the magnetic field H2. Thus, by adjusting the orientation of the easy and hard axes, two different maximum current values can be obtained.

Thus, an example of a single-loop MEMS inductor has been described in accordance with the present invention. One of the advantages of the inductor of the present invention is that the inductor provides very, very low resistance, satisfying resistance requirements of a few milliohm.

In addition, the inductor of the present invention can be formed to be quite large, e.g., having a footprint approximately the same size as the die, to enclose a large magnetic core structure to generate nano-Henry inductance levels. Further, the inductor of the present invention can have one of two saturation currents, depending on the easy-hard orientation of magnetic core structure 122.

Figure 2A:
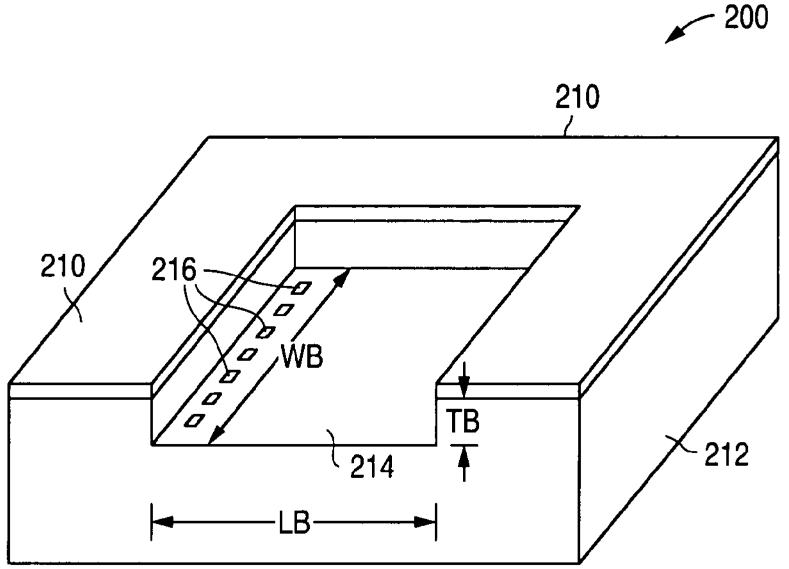
FIGS. 2A-2G are a series of perspective views illustrating a method 200 of forming a MEMS inductor in accordance with the present invention.

FIGS. 2A-2G show a series of perspective views that illustrate a method 200 of forming a MEMS inductor in accordance with the present invention. As shown in FIG. 2A, a mask 210 is formed on a dielectric layer 212, and etched to form a rectangular opening 214 that has a length LB, a width WB, and a thickness TB. In addition, at one end of opening 214, a number of vias 216 are exposed. Mask 210 is then removed.

Figure 2B:
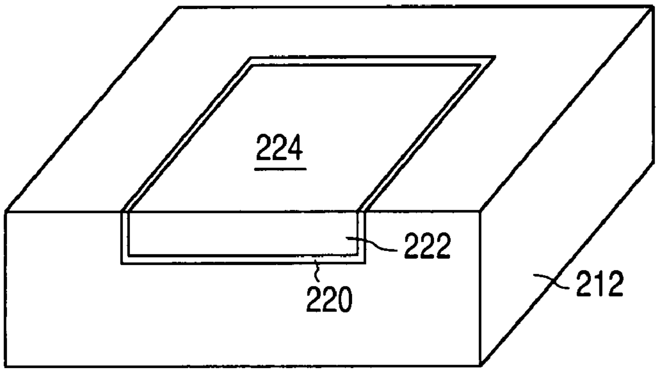

Next, as shown in FIG. 2B, a barrier layer 220 is formed on dielectric layer 212, followed by the formation of a copper seed layer 222 and electroplating. The resulting layer is then planarized until removed from the top surface of dielectric layer 212, thereby forming a bottom conductive plate 224. Barrier layer 220 prevents copper seed layer 222, such as chromium, copper, chromium (Cr—Cu—Cr), from diffusing into dielectric material 212 and can be implemented with, for example, tantalum Ta or tantalum nitride TaN. The planarization can be performed using, for example, conventional chemical mechanical polishing.

Figure 2C:
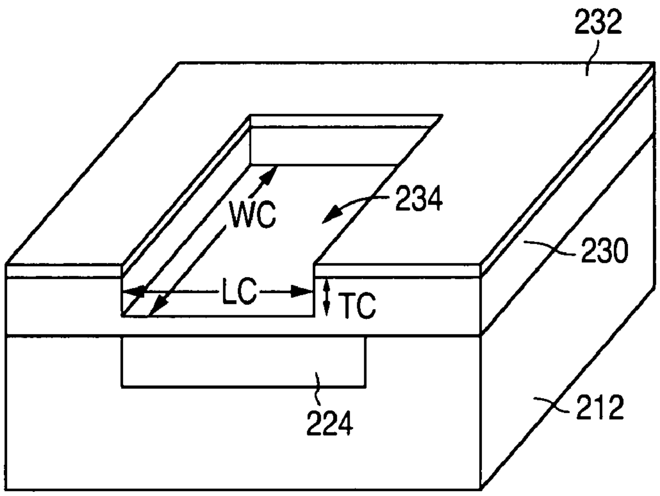

Following this, as shown in FIG. 2C, an isolation layer 230, such as photosensitive epoxy, is formed on dielectric layer 212 and bottom conductive plate 224. After this, a mask 232 is formed on isolation layer 230. Isolation layer 230 is then etched to form a core opening 234 that has a length LC, a width WC substantially the same as the width WB of bottom conductive plate 224, and a thickness TC. Mask 232 is then removed.

Figure 2D:
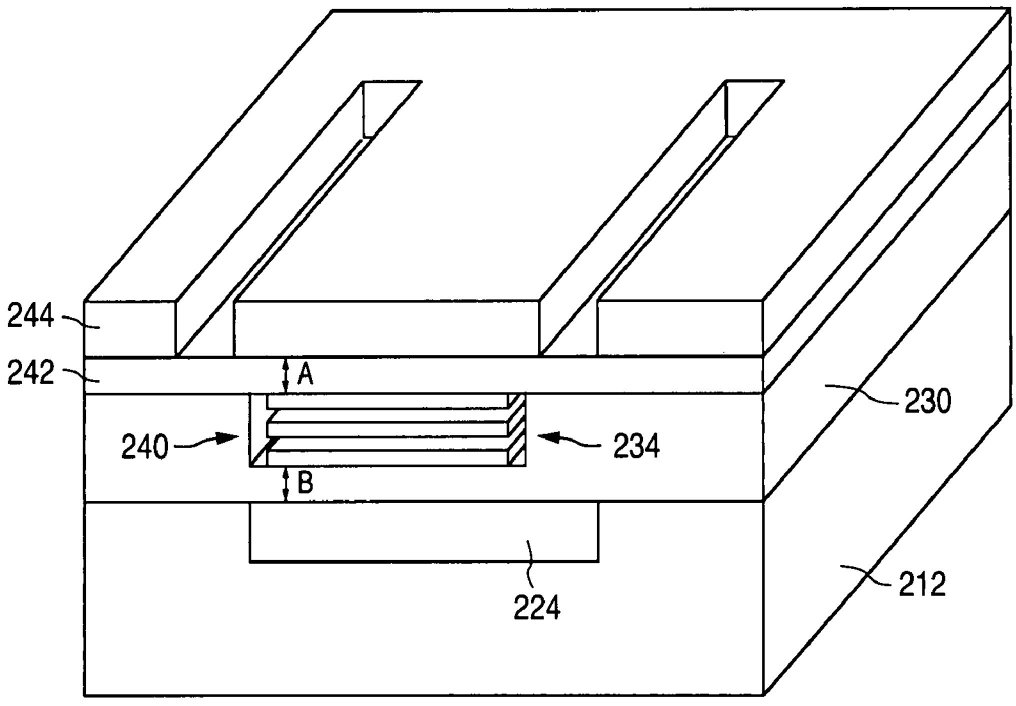

Next, as shown in FIG. 2D, a magnetic core structure 240 is located in core opening 234 using prior-art methods. For example, Park et al., "Ultralow-Profile Micromachined Power Inductors with Highly Laminated Ni/Fe Cores: Application to Low-Megahertz DC-DC Converters," IEEE Transactions of Magnetics, Vol. 39, No. 5, September 2003, pp 3184-3186, teach the formation of a MEMS magnetic core structure that uses laminated Ni—Fe structures.

As taught by Park et al., to form a magnetic core structure, a mold is filled with sequential electrodeposition of Ni—Fe (80%-20%) and Cu layers. In accordance with the present invention, the mold is rectangular and the electrodeposition can occur in the presence of a magnetic field so that each laminated NiFe/Cu layer has an easy axis and a hard axis. The easy and hard axes are inherent properties of a magnetic material that is formed in the presence of a magnetic field.

After a number of layers have been formed, the mold is removed, and the Cu is then etched away from between the NiFe layers to form magnetic core structure 240. As a result of forming the laminated NiFe layers in the presence of a magnetic field, the laminated layers can have an easy axis that coincides with the length, or a hard axis that coincides with the length, depending on the orientation of the magnetic field during electrodeposition.

Following the formation of magnetic core structure 240, a layer of isolation material 242, such as photosensitive epoxy, is formed over magnetic core structure 240, and then planarized until a thickness A and a thickness B are substantially equal. After this, a mask 244 is formed on isolation layer 242 to define the sidewalls.

Figure 2E:
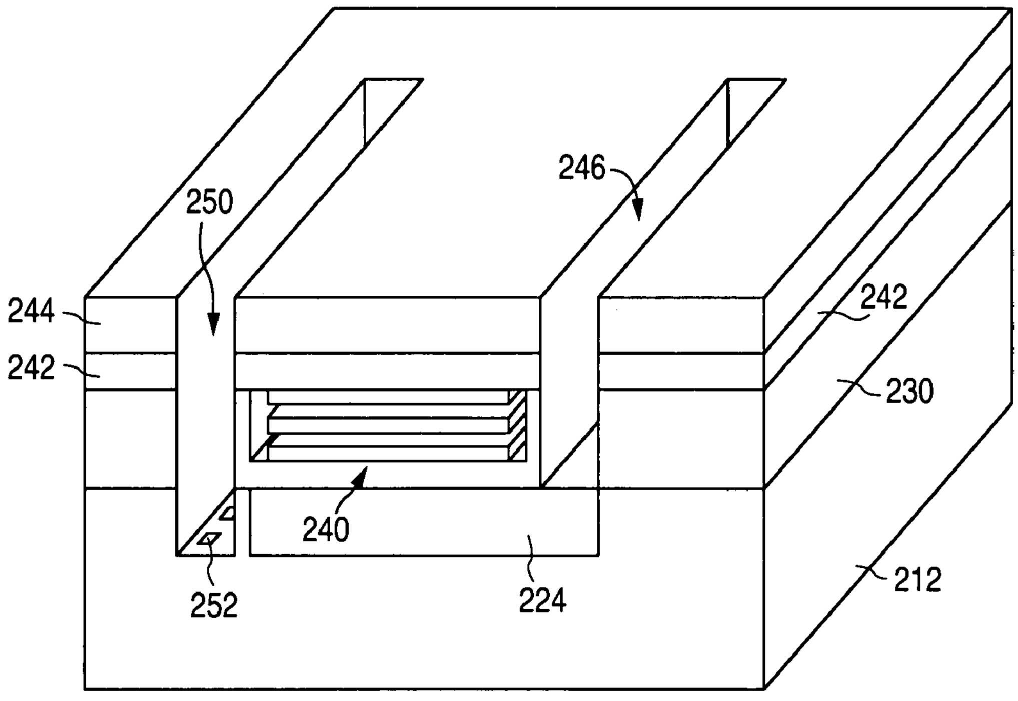

As shown in FIG. 2E, after mask 244 has been formed, isolation layer 242 and then isolation layer 230 are etched to form a first opening 246 that exposes one end of bottom conductive plate 224, and a second opening 250 that exposes a number of vias 252. Mask 244 is then removed.

Figure 2F:
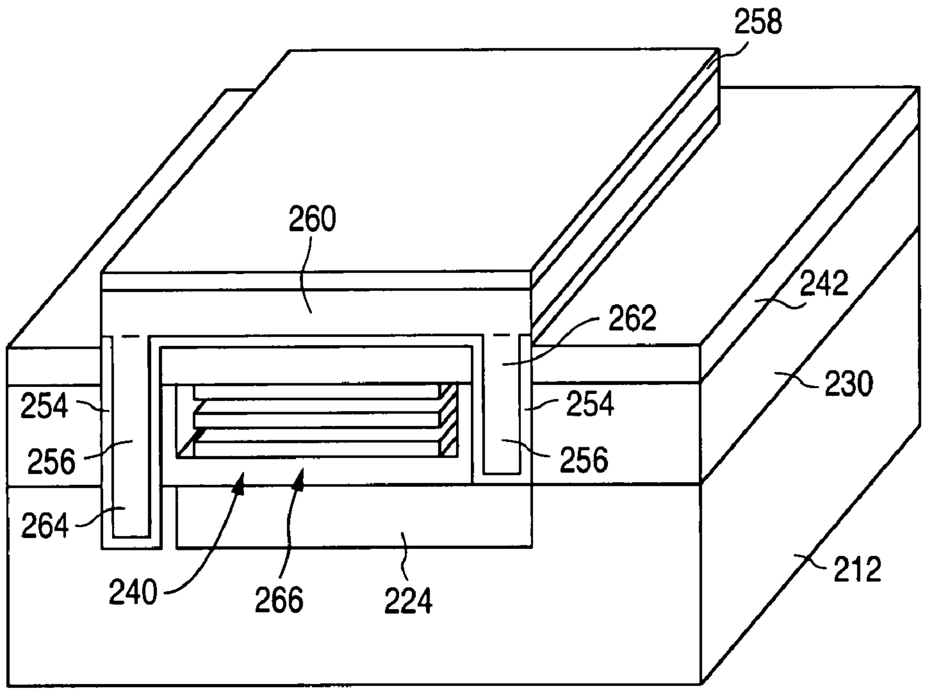

Next, as shown in FIG. 2F, a barrier layer 254 is formed on isolation layer 242, followed by the formation of a copper seed layer 256 and electroplating. After this, a mask 258 is formed and patterned. The exposed material is then etched to form a top conductive plate 260, a conductive sidewall 262, and a conductive sidewall 264.

Conductive sidewall 262 has a bottom surface that contacts the top surface of base conductive plate 224, and a top surface that contacts the bottom surface of top conductive plate 260. Conductive sidewall 264 has a top surface that contacts the bottom surface of top conductive plate 260, and a bottom surface that contacts the vias (252).

Base conductive plate 224 and top conductive plate 260 define an enclosed region 266 that lies only between the base and top conductive plates 224 and 260. In addition, enclosed region 266 can further be defined by conductive sidewall 262 and conductive sidewall 264, such that enclosed region 266 lies only between the base and top conductive plates 224 and 260, and between conductive sidewalls 262 and 266.

Figure 2G:
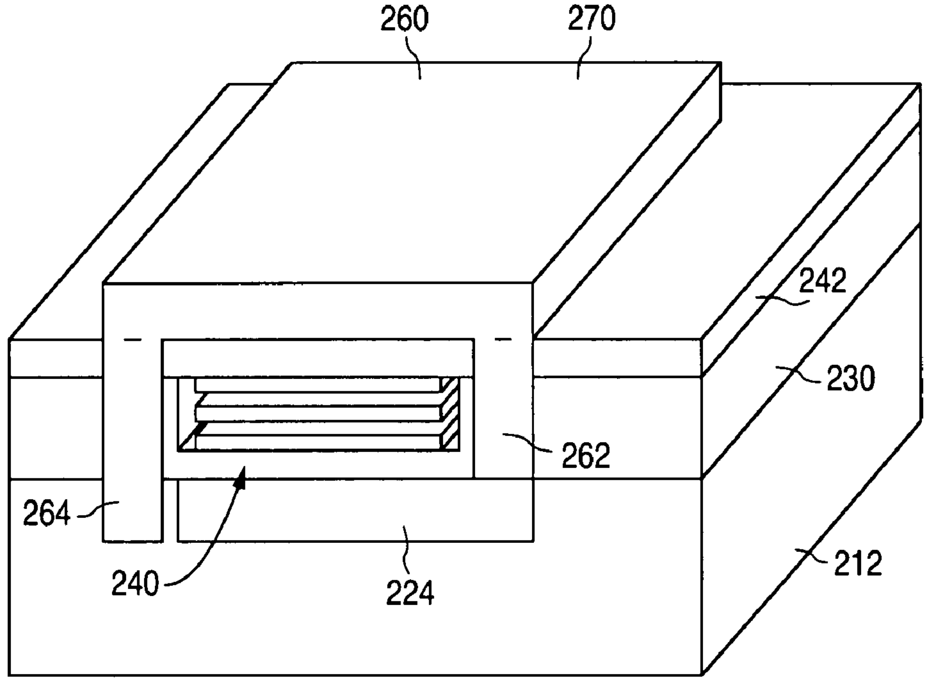

As shown in FIG. 2G, once the exposed material has been removed, mask 258 is removed to form a single-loop inductor 270. Single-loop inductor 270 can have very low resistance due to its width, up to the width of the underlying die, and relatively thick lines. For example, the thickness of bottom conductive plate and top conductive plate 224 and 260 can each be 20-50 μm thick.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:

forming a first conductive plate that touches a dielectric layer, the first conductive plate having a first side region and a second side region that lies opposite to and spaced apart from the first side region; and forming a conductive structure, the conductive structure having:

a second conductive plate that lies over and is spaced apart from the first conductive plate, the second conductive plate having a first side region and a second side region that lies opposite to and spaced apart from the first side region of the second conductive plate;

a first side wall that touches the second side region of the first conductive plate and the second side region of the second conductive plate; and a second side wall that touches the first side region of the second conductive plate, the second side wall lying laterally adjacent to and spaced apart from the first side region of the first conductive plate.

2. The method of claim 1 wherein the first side region of the first conductive plate touches a first via.

3. The method of claim 2 wherein the second side wall touches a second via that lies laterally adjacent to the first via.

4. The method of claim 2 wherein forming a conductive structure includes forming an opening that exposes the second side region of the first conductive plate, and an opening that exposes a second via that lies adjacent to the first via.

5. The method of claim 2 and further comprising:

forming an isolation layer on the dielectric layer and the first conductive plate to cover the first conductive plate;

forming an opening in the isolation layer over the first conductive plate, the opening having a bottom surface spaced apart from a top surface of the first conductive plate.

6. The method of claim 5 wherein the opening lies only over the first conductive plate.

7. The method of claim 5 wherein forming a conductive structure includes forming an opening in the isolation layer to expose the second side region of the first conductive plate, and an opening in the isolation layer and the dielectric layer to expose a second via that lies adjacent to the first via.

8. The method of claim 1 wherein the first side region of the first conductive plate touches a plurality of spaced-apart laterally-adjacent first vias.

9. The method of claim 8 wherein the second side wall touches a plurality of laterally-adjacent second vias that lie laterally adjacent to the plurality of first vias.

10. The method of claim 1 wherein an interior region is defined to lie only between the first conductive plate and the second conductive plate, between the first side wall and the second side wall, and be spaced apart from the first conductive plate, the second conductive plate, the first side wall, and the second side wall, the interior region being electrically isolated from all non-interior regions.

11. The method of claim 1 wherein forming a first conductive plate includes:

forming a dielectric opening in the dielectric layer, the dielectric opening having a first side and a second side that lies opposite to the first side of the dielectric opening; and forming the first conductive plate in the dielectric opening.

12. The method of claim 11 wherein the dielectric opening exposes a plurality of laterally-adjacent vias that lie along the first side of the dielectric opening.

13. The method of claim 12 wherein the first conductive plate includes copper.

14. The method of claim 1 wherein forming a conductive structure includes forming an opening that exposes the second side region of the first conductive plate.

* * * * *